(12) United States Patent
Röhner et al.

(10) Patent No.: US 10,242,922 B2
(45) Date of Patent: Mar. 26, 2019

(54) CIRCUIT AND METHOD FOR INTERNALLY ASSESSING DIELECTRIC RELIABILITY OF A SEMICONDUCTOR TECHNOLOGY

(71) Applicant: Infineon Technologies AG, Neubiberg (DE)

(72) Inventors: Michael Röhner, Munich (DE); Stefano Aresu, Unterhaching (DE); Marco Faricelli, Villach (AT)

(73) Assignee: Infineon Technologies AG, Neubiberg (DE)

( * ) Notice: Subject to any disclaimer, the term of this patent is extended or adjusted under 35 U.S.C. 154(b) by 1039 days.

(21) Appl. No.: 14/151,528

(22) Filed: Jan. 9, 2014

(65) Prior Publication Data

US 2015/0194358 A1    Jul. 9, 2015

(51) Int. Cl.
*H01L 21/66* (2006.01)
*G01R 31/12* (2006.01)
*G01R 31/26* (2014.01)
*G01R 31/28* (2006.01)
*G01R 31/02* (2006.01)

(52) U.S. Cl.
CPC ............ *H01L 22/34* (2013.01); *G01R 31/129* (2013.01); *G01R 31/2642* (2013.01); *G01R 31/2894* (2013.01); *G01R 31/025* (2013.01)

(58) Field of Classification Search
None
See application file for complete search history.

(56) References Cited

U.S. PATENT DOCUMENTS

| | | | | | |
|---|---|---|---|---|---|
| 4,420,497 | A | * | 12/1983 | Tickle | H01L 21/02238 205/766 |
| 6,492,240 | B1 | * | 12/2002 | Wang | H01L 27/0629 257/E21.004 |
| 2007/0252611 | A1 | * | 11/2007 | Kerber | G01R 31/2884 324/750.3 |
| 2010/0068831 | A1 | * | 3/2010 | Barber | H01L 22/12 438/13 |
| 2010/0253380 | A1 | * | 10/2010 | Martin | H01L 22/34 324/762.01 |

(Continued)

FOREIGN PATENT DOCUMENTS

TW        466672 B     12/2001

OTHER PUBLICATIONS

Kerber, A. et al, "Lifetime Prediction for CMOS Devices with Ultra Thin Gate Oxides Based on Progressive Breakdown," IEEE 45th Annual International Reliability Physics Symposium, 2007, pp. 217-220, Phoenix, Nevada.

(Continued)

*Primary Examiner* — Jermele M Hollington
*Assistant Examiner* — Douglas X Rodriguez
(74) *Attorney, Agent, or Firm* — Murphy, Bilak & Homiller, PLLC

(57) ABSTRACT

A semiconductor wafer includes dielectric regions of different thicknesses, some of the dielectric regions being thinner and other ones of the dielectric regions being thicker. The semiconductor wafer further includes a stress circuit operable to stress at least one of the dielectric regions internally within the semiconductor wafer for assessing dielectric reliability. A corresponding method of internally assessing dielectric reliability of a semiconductor technology is also provided.

29 Claims, 7 Drawing Sheets

(56) References Cited

U.S. PATENT DOCUMENTS

| | | | | |
|---|---|---|---|---|
| 2014/0184262 A1* | 7/2014 | Poindexter | ............ | G01R 31/30 |
| | | | | 324/759.03 |
| 2014/0295172 A1* | 10/2014 | Doi | ......................... | B05D 1/38 |
| | | | | 428/332 |
| 2014/0300409 A1* | 10/2014 | Emira | ..................... | H02M 3/07 |
| | | | | 327/536 |

OTHER PUBLICATIONS

Linder, B.P. et al, "Gate Oxide Breakdown Under Current Limited Constant Voltage Stress," IEEE 2000 Symposium on VLSI Technology Digest of Technical Papers, 2000, pp. 214-215.

* cited by examiner

CIRCUIT AND METHOD FOR INTERNALLY ASSESSING DIELECTRIC RELIABILITY OF A SEMICONDUCTOR TECHNOLOGY

TECHNICAL FIELD

The present application relates to assessing the reliability of new semiconductor technologies, in particular assessing dielectric reliability of new semiconductor technologies.

BACKGROUND

Failure rate targets for automotive technologies are fairly stringent e.g. typically below 1 ppm. On the other hand, the reliability margin for CMOS (complementary metal oxide semiconductor) devices is reduced and the electrical fields increased with decreasing feature size. For thin gate oxides and especially for high-k dielectrics a new methodology is needed to allow such high electric fields. Due to this decreased reliability margin, the first dielectric breakdown is no longer regarded as a hard fail for a digital circuit. Instead, a progressive phase is allowed where the integrity of the dielectric is permitted to steadily decrease until a hard failure occurs. The electric fields for isolation dielectrics such as inter-metal dielectrics, shallow trench isolation, deep trench isolation, etc. are also increased. This is especially true if higher voltages are used in CMOS technologies for power applications with DMOS (double-diffused metal-oxide-semiconductor), BEOL (back-end-of-the line) capacitors such as VPP (vertical parallel plate) capacitors, grid capacitors, sandwich capacitors, etc. and similar devices.

As with thin dielectrics where transistor and resistor limited breakdown and even digital circuits such as ring oscillators and logic elements are used to assess the product relevant breakdown or degradation behaviour such as NBTI (negative bias temperature instability) and HCS (hot carrier stress), conventional stress by an external circuit delivers too much energy and usually results in a hard breakdown of the dielectric. An external resistor can help mitigate this problem, but the external circuitry and equipment used to stress the dielectrics still dominate the degradation behaviour and therefore render the assessment of the breakdown/degradation behaviour unreliable. In addition, the cables used to connect the external circuitry and test equipment to the semiconductor wafer under stress charge during stressing and discharge when dielectric breakdown occurs, further increasing the external influences on the dielectric breakdown/degradation behaviour.

SUMMARY

According to an embodiment of a semiconductor wafer, the semiconductor wafer comprises dielectric regions of different thicknesses. Some of the dielectric regions are thinner and other ones of the dielectric regions are thicker. The semiconductor wafer further comprises a stress circuit operable to stress at least one of the dielectric regions internally within the semiconductor wafer for assessing dielectric reliability.

According to an embodiment of a method of assessing dielectric reliability of a semiconductor technology, the method comprises: fabricating a semiconductor wafer including dielectric regions of different thicknesses, some of the dielectric regions being thinner and other ones of the dielectric regions being thicker; and stressing at least one of the dielectric regions internally within the semiconductor wafer to assess dielectric reliability.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a product-relevant stress circuit for internally stressing and assessing the dielectric reliability of new semiconductor technologies where high voltages are needed for stressing dielectric regions. The stress circuit is fabricated on the same semiconductor wafer as the dielectric test structures so that the dielectric degradation behaviour is not dominated by external circuitry and stress equipment. That is, the stress circuit described herein yields product-relevant degradation data without the influence of an external circuit. As such, device testing by a product-relevant driving element (e.g. voltage converter) can be realized which excludes the influence of external measurement equipment used in standard tests. A charge pump is another example of such a product-relevant driving element with the additional feature to generate higher voltages. A correct reliability assessment can be done based on the resulting product-relevant degradation data, yielding lifetime enhancement. With the new dielectric stressing methodologies and stress circuitry described herein, the reliability of new products can be guaranteed with a higher degree of confidence.

Figure 1:
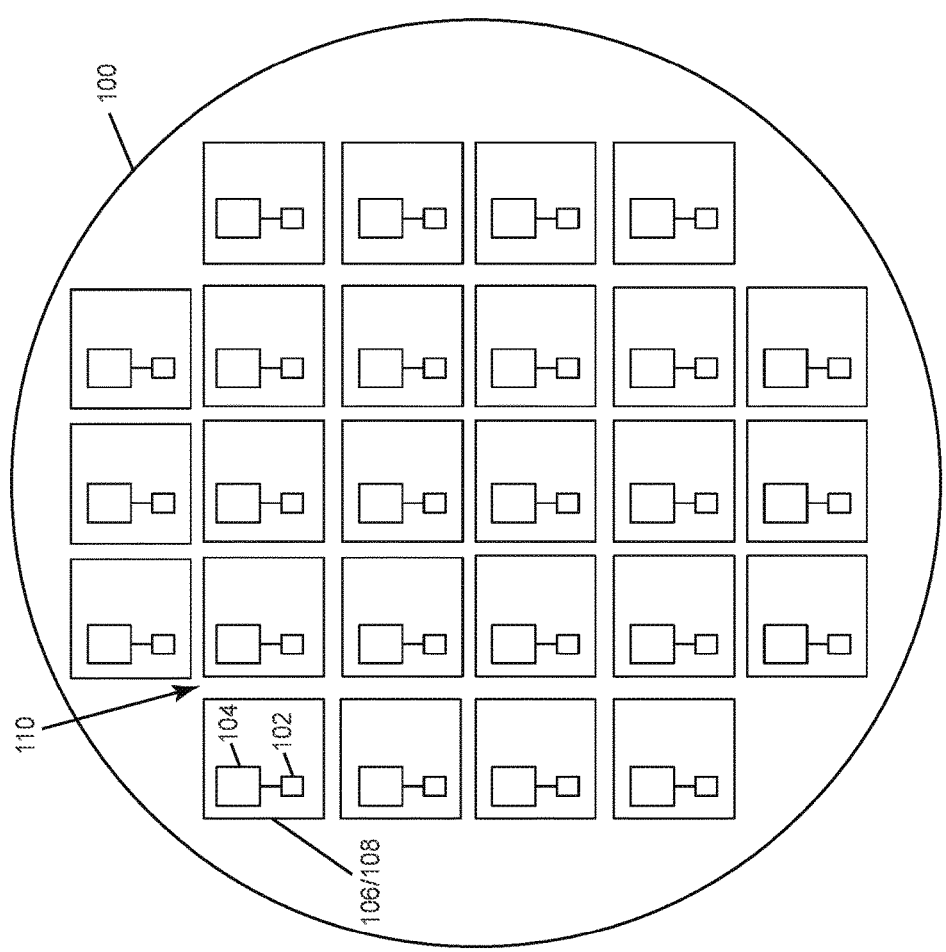
FIG. 1 illustrates a block diagram of an embodiment of a semiconductor wafer with a stress circuit for internally stressing dielectric regions fabricated on the wafer.

FIG. 1 illustrates an embodiment of a semiconductor wafer 100 that comprises dielectric regions 102 of different thicknesses, some of the dielectric regions being thinner (e.g. gate oxides) and other ones of the dielectric regions being thicker (e.g. thick oxide for drain extensions in the case of DMOS devices, capacitor dielectrics, resistors, inter-level dielectrics, shallow trench isolation, field oxide, etc.). That is, the semiconductor technology used to fabricate the wafer 100 has a range of available dielectric thicknesses. The stressing methodologies described herein can be used for assessing dielectric reliability, with the thicker end of the dielectric range being of particular interest.

The semiconductor wafer 100 also comprises a stress circuit 104 operable to stress at least one of the dielectric regions 102 internally within the semiconductor wafer 100 for assessing dielectric reliability. Because the stress circuit 104 is fabricated on the semiconductor wafer 100 as the dielectric test structures 102, the degradation behaviour of the thick dielectric material assessed by the stress circuit 104 is not dominated by external circuitry and stress equipment. In addition, both the generation and driving capability of the stress circuit 104 are product-relevant and therefore represent the conditions in a true CMOS product.

According to one embodiment, the semiconductor wafer 100 is a test wafer used to assess the reliability of new semiconductor technologies, including dielectric reliability. According to this embodiment, the test wafer 100 has a plurality of test sites 106, each of the test sites 106 including the stress circuit 104.

According to another embodiment, the semiconductor wafer 100 is a product wafer having a plurality of product chips (dies) 108 such as power transistor chips. Each of the product chips 108 or a monitoring region 110 between adjacent ones of the product chips 108 (so-called kerf test sites) includes the stress circuit 104. In the case of the stress circuit 104 being included in product chips 108, the stress circuit 104 can be further operable to disable each product chip 108 for which a current leakage limit is exceeded as a result of stressing at least one of the dielectric regions 102 included in that product chip 108. That is, the stress circuit 104 can include a monitor for measuring the leakage current of each dielectric region 102 under stress and a comparator for comparing the measured leakage current to a threshold value. If the measured leakage current exceeds the threshold value, the stress circuit 104 can disable the product chip 108 e.g. by disabling the power supply of the product chip 108.

Figure 2:
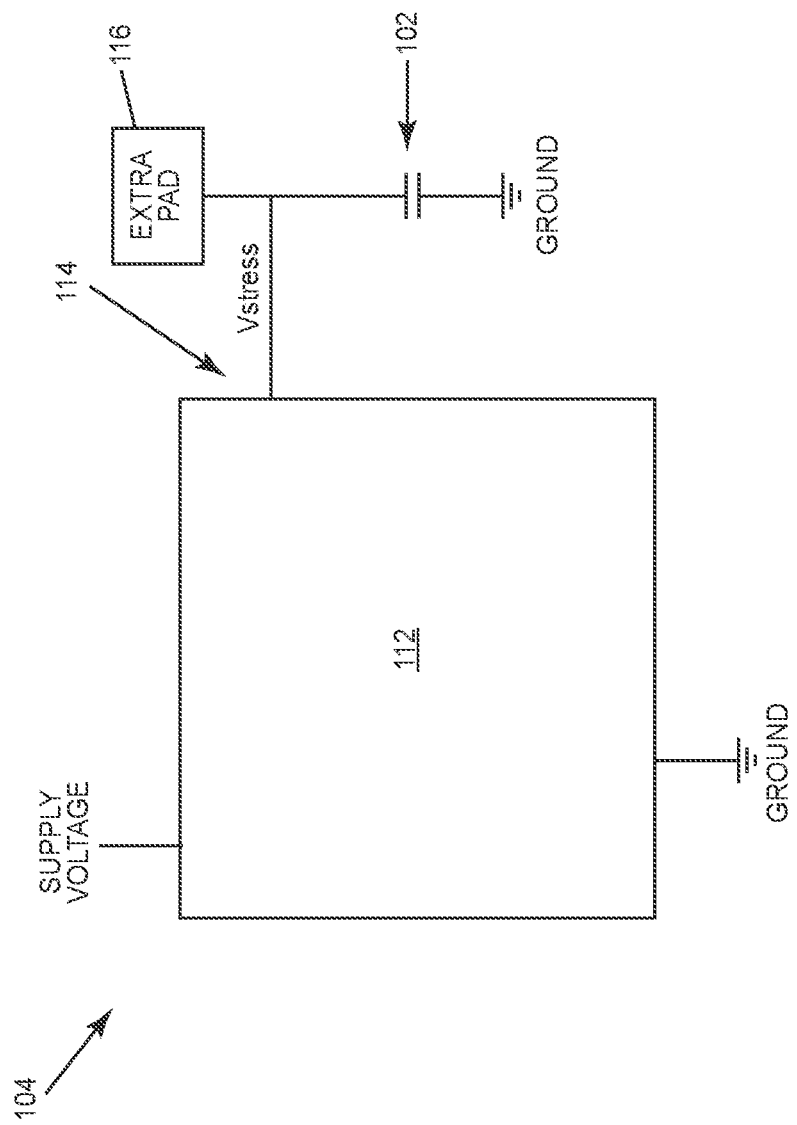
FIG. 2 illustrates a block diagram of an embodiment of the internal stress circuit shown in FIG. 1.

FIG. 2 shows an embodiment of the stress circuit 104 in more detail, where one of the thicker dielectric regions 102 is under stress and illustrated as a capacitor. In general, a dielectric region 102 of any thickness can be stressed by the stress circuit 104. For example, the stress circuit 104 can stress thicker dielectric regions 102 such as drain extensions with thick oxide, capacitors, resistors, isolation between adjacent metal lines, shallow trench isolation, field oxide, etc. In some embodiments, each thicker dielectric region 102 stressed by the stress circuit 104 is at least 5 nm thick.

According to one embodiment of the stress circuit 104, the circuit 104 is operable to stress at least one of the dielectric regions 102 internally within the semiconductor wafer 100 by applying a voltage (Vstress) across the dielectric region 102 under stress. In one embodiment, the stress circuit 104 is connected to a supply voltage and applies a higher stress voltage (Vstress) than the supply voltage to the dielectric region 102 under stress. For example, the supply voltage can be 5V or less and the voltage applied by the stress circuit 104 can range between 5V and 200V. Different types of circuits can be used to realize such a higher stress voltage. For example, the stress circuit 104 can include a DC-DC-converter (e.g. charge pump, a linear voltage regulator, a buck converter or a buck-boost converter) 112 or any type of voltage converter.

A charge pump is a widely used circuit for generating higher voltages on a chip. The charge pump 112 in the proposed implementation allows a sweep of the stress voltage and biasing of the dielectric region 102 under stress. The charge pump 112 is connected to a supply voltage. The charge pump 112 delivers at its output 114 a higher voltage (Vstress) depending on the number of stages of the pump 112, the pump frequency, etc. The dielectric region 102 to be stressed is connected to the output 114 of the charge pump 112.

The higher voltage used for stressing the dielectric region 102 is generated by an internal circuit and therefore the degradation behavior of the stressed dielectric region 102 is like in an actual product. For example, the energy available for a dielectric breakdown is determined by the driving capability of the charge pump 112. In some embodiments, the charge pump 112 has a current capability of 500 µA or less so that the stress circuit 104 can realize a relatively high internal stress voltage with a typical driving current capability of a circuit. The driving capability can additionally be tuned e.g. by the supply voltage/clock frequency, etc. An extra pad 116 can be provided for externally observing degradation of the dielectric region 102 under stress.

Figure 3:
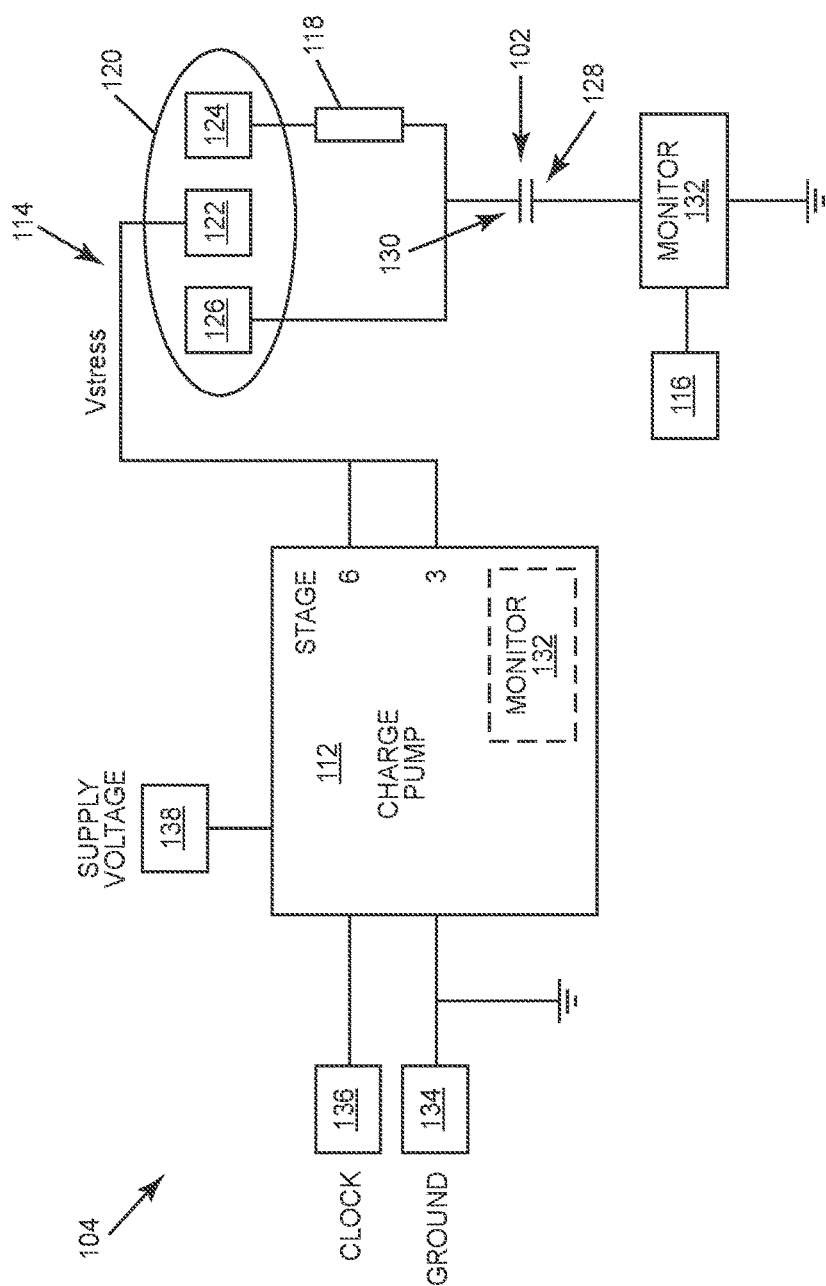
FIG. 3 illustrates a block diagram of another embodiment of the internal stress circuit shown in FIG. 1.

FIG. 3 illustrates an embodiment of the stress circuit 104 where different numbers of stages (6, 3 in FIG. 3) can be included in the charge pump 112 so that the stress voltage output by the charge pump 112 can be tuned depending on the type of dielectric region 102 to be stressed. Also, the stress circuit 104 can include a series resistor 118 between the charge pump output 114 and the dielectric region 102 under stress.

Extra pads 120 can be provided to separate the charge pump 112 and the dielectric region 102 under stress, which is shown as a capacitor in FIG. 3 for ease of illustration only. A first one 122 of the pads 120 is connected to the output 114 of the charge pump 112. A second one 124 of the pads 120 provides a selectable connection between the output 114 of the charge pump 112, a series resistor 118 and the dielectric region 102 under stress. A third one 126 of the pads 120 provides a selectable connection directly between the output 114 of the charge pump 112 and the dielectric region 102 under stress without the series resistor. The first pad 122 can be connected to the second or third pad 124, 126 to select the desired connection e.g. by an external jumper connection, an external short via needles, a package connection or within the metal wiring of the semiconductor wafer 100.

By providing the extra pads 120 and the different selectable connections between the output 114 of the charge pump 112 and the dielectric region 102 under stress, degradation of the dielectric region 102 under stress can be measured without the influence of the charge pump 112. Also, influence of e.g. a breakdown of the dielectric region 102 under stress on performance of the driving element (e.g. charge pump) 112 can be observed. The dielectric region 102 under stress can also be stressed by an external circuit for comparison with the internal stress results. The lower terminal 128 of the dielectric region 102 under stress can be biased to further vary the stress voltage even above the maximum voltage capability of the charge pump 112. Since the upper terminal 130 of the dielectric region 102 under stress is still connected to the charge pump 112, the breakdown behavior is still determined by the driving capability of the charge pump 112.

The stress circuit 104 can comprise a monitor 132 for monitoring the leakage current of the dielectric region 102 during stressing. For example, the stress circuit 104 can assess dielectric reliability of the wafer 100 by using the monitor 132 to measure leakage current of the dielectric region 102 under stress in response to the stress voltage applied by the charge pump 112. The monitor 132 can be designed as part of the charge pump 112 as indicated by the dashed box shown in FIG. 3, or can be separate from the charge pump 112 as indicated by the solid box shown in FIG. 3.

In either case, the monitor 132 can include an A/D (analog-to-digital) converter for capturing the voltage across the dielectric region 102 under stress. The output of the A/D can be compared to a voltage threshold. If the A/D output is too low compared to the threshold, significant leakage current is present and dielectric breakdown has occurred. Alternatively or in addition it is possible to measure directly increased leakage current through the device 102. Alternatively or in addition, the charge pump 112 can be monitored for increased current consumption during dielectric stressing. A significant increase in current consumption by the charge pump 112 can also indicate dielectric breakdown. Alternatively, the ground input 134 of the charge pump 112 can be separated from the ground of the device 102 and a bias can be applied between them to increase or decrease the voltage across the device 102. The charge pump 112 can have an internal clock or the pump clock can be externally provided at a terminal 136 so that the clock frequency of the charge pump 112 can be readily changed. The supply voltage to the charge pump 112 can also be provided by a terminal 138.

Figure 4:
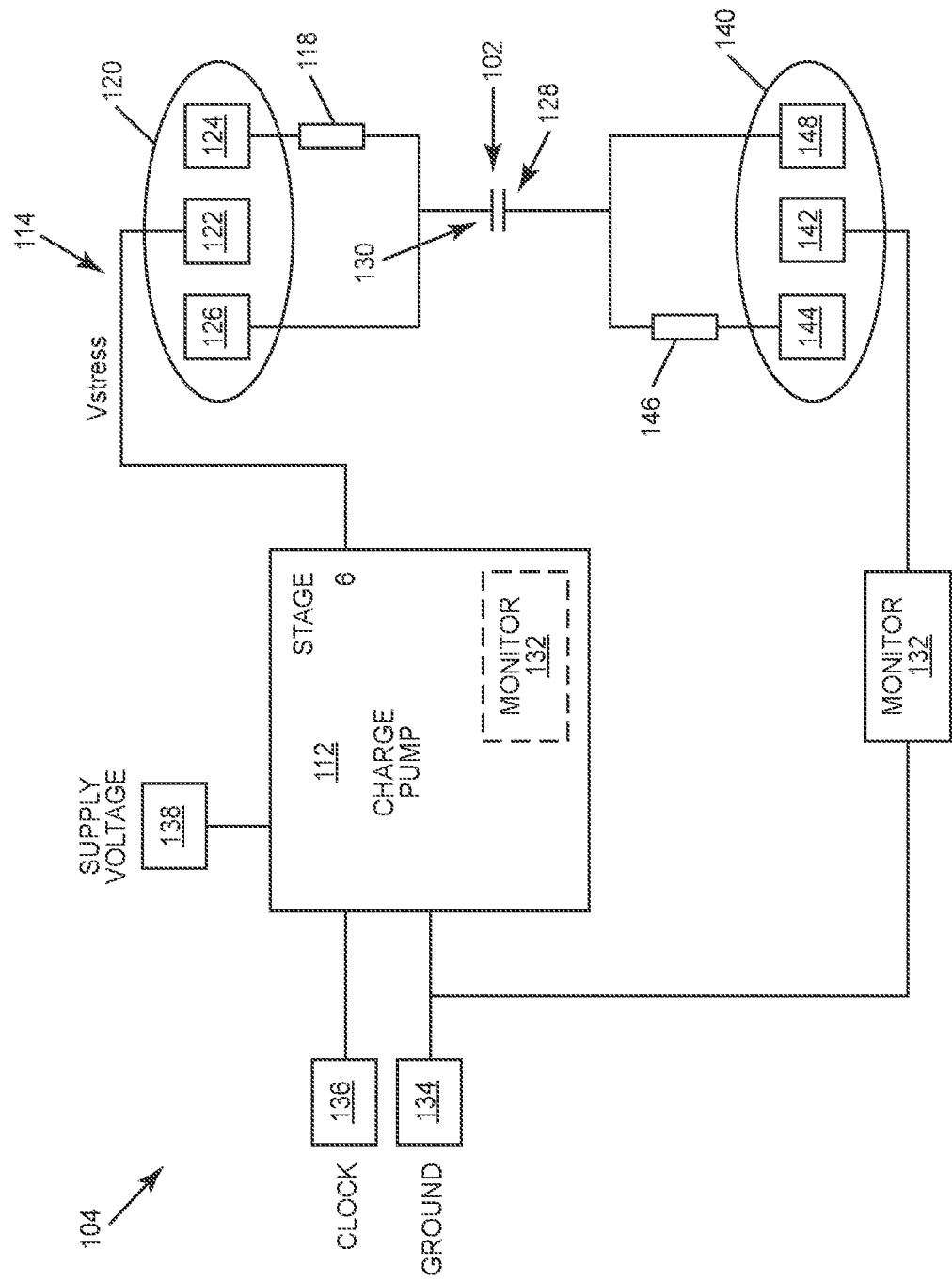
FIG. 4 illustrates a block diagram of yet another embodiment of the internal stress circuit shown in FIG. 1.

FIG. 4 illustrates an embodiment of the stress circuit 104 that is similar to the embodiment shown in FIG. 3, however, the stress circuit 104 further includes an additional set of extra pads 140 for providing at least two different selectable connections between the grounded input 134 of the charge pump 112 and the dielectric region 102 under stress. As with FIG. 3, the dielectric region 102 under stress is shown as a capacitor. However, any type of thicker dielectric region 102 can be stressed such as thick oxide of drain extensions, capacitors, resistors, isolation between adjacent metal lines, shallow trench isolation, and/or field oxide or even a device stress (e.g. bias temperature stress, hot carrier stress). Thinner dielectric regions 102 such as gate dielectrics can also be stressed by the charge pump 112.

With this understanding, a first one 142 of the additional pads 140 is connected to the grounded input 134 of the charge pump 112. A second one 144 of the additional pads 140 provides a selectable connection between the grounded input 134 of the charge pump 112 and the dielectric region 102 under stress through a series resistor 146. A third one 148 of the additional pads 140 provides a selectable connection directly between the grounded input 134 of the charge pump 112 and the dielectric region 102 without the series resistor. The first pad 142 can be connected to the second or third pad 144, 148 to select the desired connection e.g. by an external jumper connection, a package connection or within the metal wiring of the semiconductor wafer 100.

Previously described herein are different embodiments of the stress circuit 104 included within a semiconductor wafer 100 for internally stressing dielectric regions 102 fabricated on the wafer 100. Especially for dielectrics it is interesting to investigate the breakdown behavior of the isolating dielectric material. For guaranteeing the integrity of the dielectric at use conditions for several years, usually a much shorter stress test is done. In this short test, the dielectric must withstand a much higher voltage than the rated operating voltage for the dielectric. In some cases, such high voltages cannot be delivered by a charge pump or other similar circuit. For that reason various test structures are described next for investigating the dielectric strength of an isolating layer.

Figure 6:
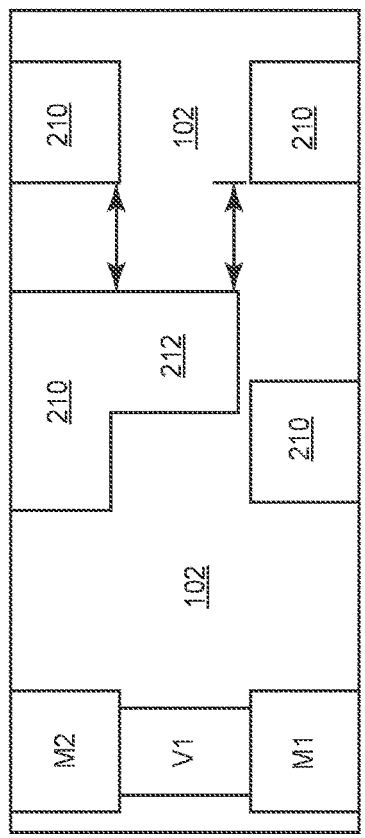
FIG. 6 illustrates a cross-sectional view of another embodiment of a dielectric test structure having an intentional layout misalignment.
Figure 7:
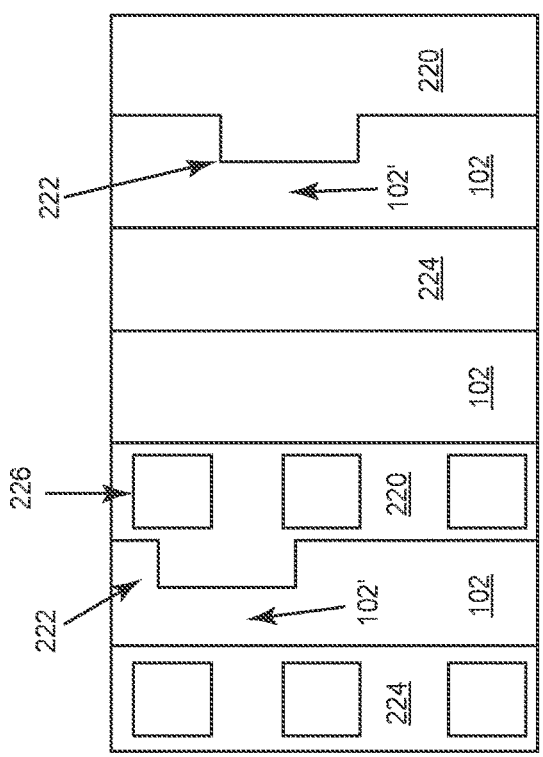
FIG. 7 illustrates a plan view of yet another embodiment of a dielectric test structure having an intentional layout misalignment.
Figure 5:
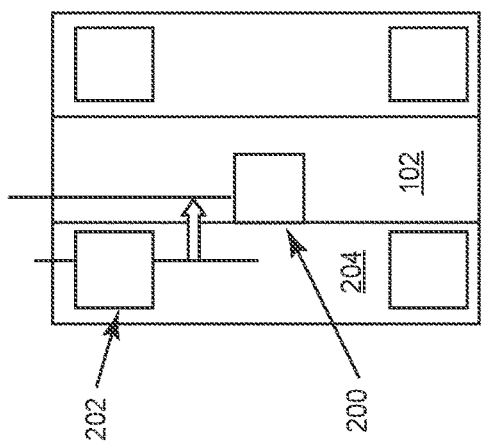
FIG. 5 illustrates a plan view of an embodiment of a dielectric test structure having an intentional layout misalignment.

FIGS. 5 through 7 illustrate different embodiments of dielectric test structures having an intentional layout misalignment so that each dielectric region 102 under stress by the internal stress circuit 104 has an artificially weak breakdown characteristic. This way, the reliability of the dielectric regions 102 under stress can be assessed at a lower stress voltage than if the intentional layout misalignment were omitted.

For an existing process flow with a minimum spacing (defined by a design manual) it is often desirable to investigate sub-nominal spacing. For example, the intrinsic behavior of process corners with slightly sub-nominal spacing or even the behavior of extrinsic devices such as devices with a thinned dielectric isolation can be investigated. To some extent a sub-nominal spacing (e.g. 20% less spacing) can be realized by lithography/etching, which would cover the process corners of intrinsic devices. Much effort is needed to fabricate significant sub-nominal spacings (sub-nominal regarding the lithography capabilities). For example, usually two lithography steps (e.g. Litho-Etch-Litho-Etch=LELE, Litho-Freeze-Litho-Etch=LFLE) or self-aligned double patterning (SADP) are done. For kerf test structures, however, the process flow is usually kept as for standard products, only the lithography/etch can be tuned somewhat to realize a slightly sub-nominal spacing. However, a true sub-nominal structure (which can be e.g. a significantly thinned dielectric isolation) can still be realized within an existing technology flow without additional process effort. Similar as for LELE/LFLE, two lithography steps are employed. These lithography steps however are already exist in many standard process flows. For metallization, usually two lithography steps are used for fabrication of the metal lines and vias. These can be used to effectively create locally sub-nominal spacings between metal lines.

Controlled artificial weaknesses can be built-in to the dielectric test structures so that the breakdown occurs at a voltage low enough to be reached e.g. by a charge pump. The breakdown occurs at a lower voltage, which represents a product-like situation with a stress closer to the use voltage. This makes the breakdown behavior more product-relevant. The artificial weakness represents both the intrinsic behavior of a thinned dielectric as well as an extrinsic defect in the dielectric (e.g. particle).

In FIG. 5, the intentional layout misalignment is realized by providing a misaligned via 200 in a thicker dielectric region 102 under stress. The offset of the misaligned via 200 from other vias 202 connected to metal lines 204 within the thicker dielectric region 102 under stress is smaller than otherwise permitted for the semiconductor technology under analysis as indicated by the arrow in FIG. 5. Since the lithography of the via 200 is separated from the lithography of the metal lines, any separation between the via 200 (including the line above the via) and an opposing line is possible. As such, dielectric breakdown will occur at a lower voltage than if the via 200 was not misaligned.

In FIG. 6, a test structure fabricated in a dual damascene technology with sub-nominal spacings (indicated by the arrows) provided between the edge of one metal line 210 and the edge of an adjacent metal line 210, and between the edge of the underlying dual damascene via 212 and the corresponding adjacent metal line 210. A sub-nominal distance (spacing) can also be realized for other metal etch processes such as for Al-metallization.

In FIG. 7, the intentional layout misalignment is realized by providing a metal line 220 with a protrusion 222 facing an adjacent metal line 224 between which a thicker dielectric region 102 under stress is interposed. Each protrusion 222 extends toward another metal line 224 adjacent the thicker dielectric region 102 under stress to create a thinner dielectric region 102' between the protrusion 222 and the adjacent metal line 224. The protrusion 222 can be formed in a metal line 220 with or without vias 226. In each case, dielectric breakdown will occur at a lower voltage than if the protrusion 222 were omitted. Here the minimum spacing between the metal lines 220, 224 is given by the minimum distance which can be resolved by lithography, i.e. there is a ground rule violation (for the lithography process). However, any distance between the metal line 224 and protrusion 222 can be chosen.

Figure 8:
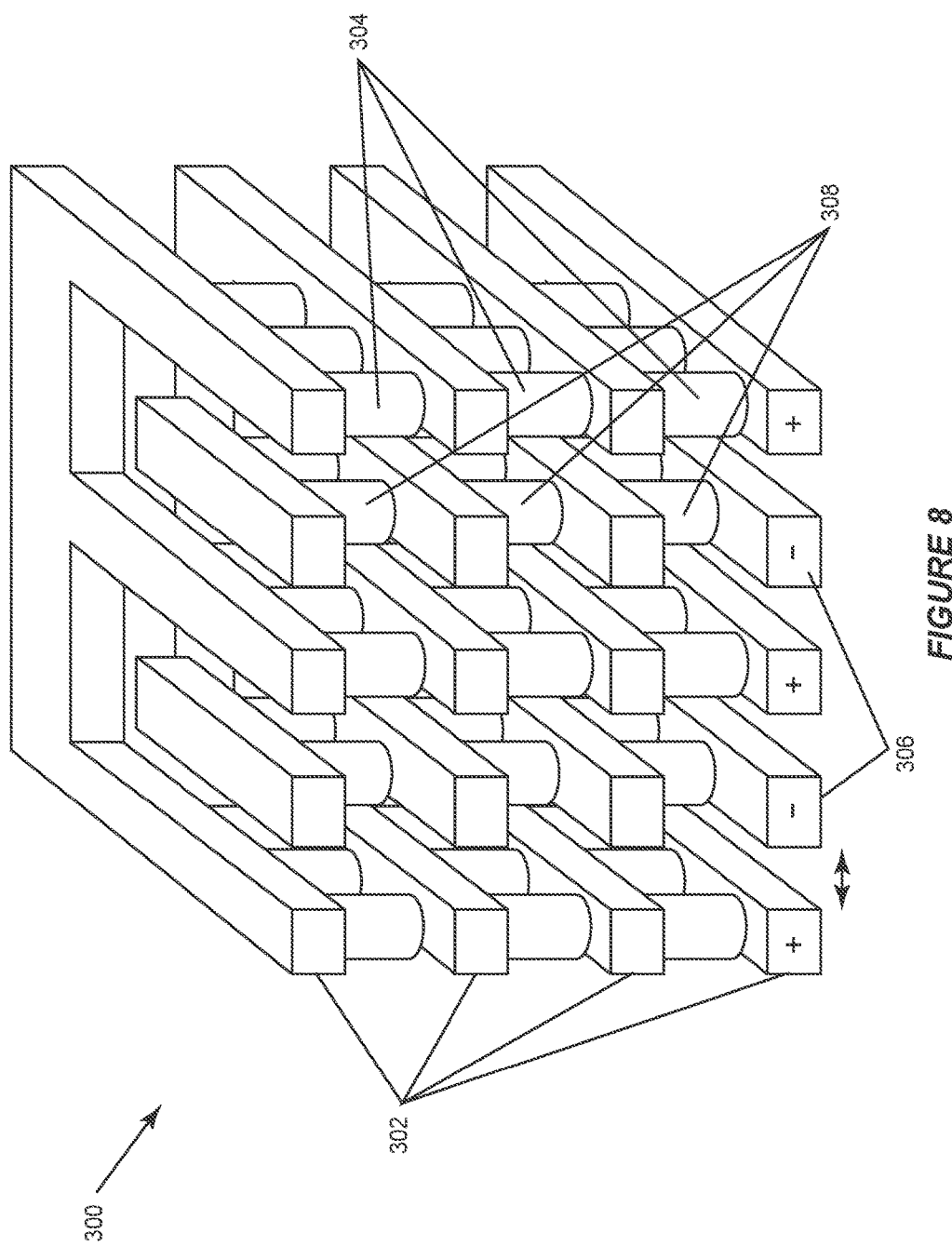
FIG. 8 illustrates a perspective view of an embodiment of a capacitor test structure.

FIG. 8 illustrates an embodiment of a capacitor structure 300 stressed according to the internal stress methodologies described herein. The capacitor structure 300 includes a first plate formed by metal lines 302 in different metal layers interconnected by vias 304 and biased at a positive polarity (+), and a second plate formed by other metal lines 306 in the metal layers also interconnected by vias 308 and biased at a negative polarity (−) or ground. The capacitor dielectric, which is stressed according to any of the embodiments described herein, surrounds the metal lines 302, 306 and vias 304, 308 and is not shown in FIG. 8 for ease of illustration of the conductive components of the capacitor structure 300. The voltage across the capacitor structure 300 can be applied by any of the stress circuit embodiments described herein. Due to the very regular shape of this structure any of the metal lines 302, 306 in the same metal layer and at different polarities can be moved closer to one another to thin the dielectric material under stress in this region, as indicated by the line with arrows in FIG. 8. This can again be done by lithography/etch corner split, by an LELE/LFLE/SADP-process. The spacings can be made smaller or a defined weak spot such as shown in FIG. 5 or 7 can be introduced. As such, dielectric breakdown will occur at a lower voltage than if the metal line spacing was relaxed i.e. the adjacent metal lines 302, 306 were spaced further apart.

Figure 9:
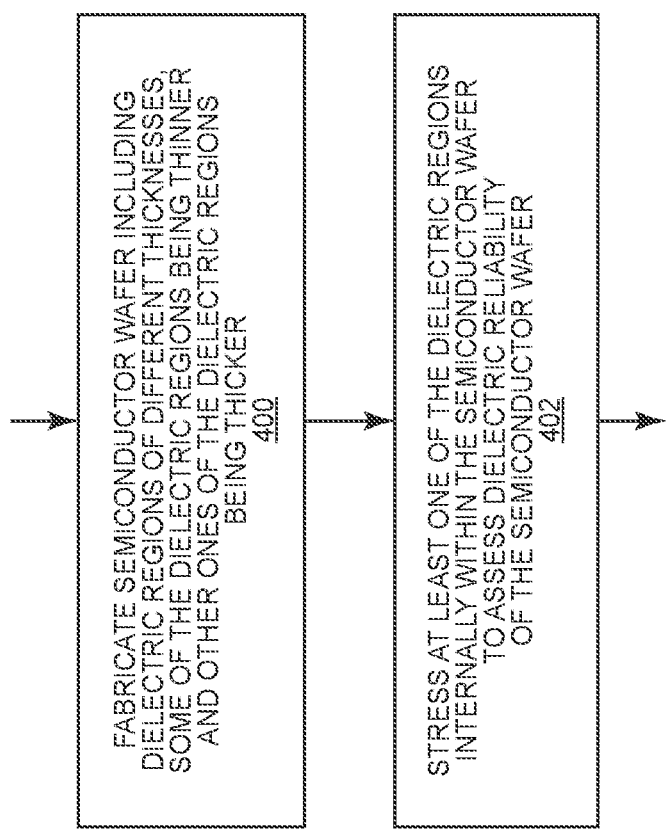
FIG. 9 illustrates a diagram of an embodiment of a method of assessing dielectric reliability of a semiconductor technology.

FIG. 9 illustrates an embodiment of a method of assessing dielectric reliability of a semiconductor technology. The method comprises fabricating a semiconductor wafer including dielectric regions of different thicknesses, some of the dielectric regions being thinner and other ones of the dielectric regions being thicker (Block 400). The method further comprises stressing at least one of the dielectric regions internally within the semiconductor wafer to assess dielectric reliability (Bock 402). At least one dielectric regions can be stressed internally within the semiconductor wafer by applying a stress voltage output by a stress circuit included in the semiconductor wafer across the at least one dielectric region, and measuring leakage current of the at least one dielectric region in response to the stress voltage as previously described herein. The stress circuit can include a charge pump connected to a supply voltage, and the charge pump can apply a higher stress voltage than the supply voltage to the at least one dielectric region also as previously described herein.

The method can further comprise providing a first selectable connection between an output of the charge pump and at least one dielectric regions, the first selectable connection comprising a series resistor between the output of the charge pump and the at least one dielectric region, and providing a second selectable connection between the output of the charge pump and the at least one dielectric region, the second selectable connection being devoid of the series resistor.

The method can also comprise providing a first selectable connection between a grounded input of the charge pump and at least one dielectric region, the first selectable connection comprising a series resistor between the grounded input of the charge pump and the at least one dielectric region, and providing a second selectable connection between the grounded input of the charge pump and the at least one dielectric region, the second selectable connection being devoid of the series resistor.

The method can additionally comprise monitoring leakage current of at least one dielectric region internally within the semiconductor wafer during stressing.

The method can further comprise forming an intentional layout misalignment within the semiconductor wafer so that at least one dielectric region have has artificially weak breakdown characteristic and the reliability of the at least one dielectric region can be assessed at a lower stress voltage than if the intentional layout misalignment were omitted. For example, forming the intentional layout misalignment can comprise forming at least one of a misaligned via in the at least one dielectric region, a metal line adjacent the at least one dielectric region with a protrusion extending toward another metal line adjacent the at least one dielectric region, and a ground rule spacing violation for metal lines between which the at least one dielectric region is interposed as previously described herein.

The method can comprise forming a pad connected to at least one dielectric region for externally observing degradation of the dielectric regions, and other steps as previously described herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor wafer, comprising:
   dielectric regions of different thicknesses, some of the dielectric regions being thinner and other ones of the dielectric regions being thicker; and
   a stress circuit fabricated on the same semiconductor wafer as the dielectric regions and operable to stress at least one of the dielectric regions internally within the semiconductor wafer for assessing dielectric reliability without the influence of an external circuit.

2. The semiconductor wafer of claim 1, wherein the thicker dielectric regions are at least 5 nm thick.

3. The semiconductor wafer of claim 1, wherein the stress circuit is operable to stress the at least one dielectric region internally within the semiconductor wafer by applying a stress voltage across the at least one dielectric region, the stress voltage exceeding a rated operating voltage for the at least one dielectric region.

4. The semiconductor wafer of claim 3, wherein the stress circuit is operable to measure leakage current of the at least one dielectric region in response to the stress voltage.

5. The semiconductor wafer of claim 3, wherein the stress voltage applied by the stress circuit is between 5V and 200V.

6. The semiconductor wafer of claim 1, wherein the stress circuit has a current capability of 500 µA or less.

7. The semiconductor wafer of claim 1, wherein the thicker dielectric regions comprise at least one of drain extensions with thick oxide, capacitors, resistors, isolation between adjacent metal lines, shallow trench isolation, and field oxide.

8. The semiconductor wafer of claim 1, wherein the stress circuit comprises a charge pump connected to a supply voltage and operable to apply a higher stress voltage than the supply voltage to the at least one dielectric region, the stress voltage exceeding a rated operating voltage for the at least one dielectric region.

9. The semiconductor wafer of claim 8, wherein the charge pump comprises a plurality of stages, and wherein the stress voltage is tunable based on the number of stages included in the charge pump.

10. The semiconductor wafer of claim 8, wherein the stress circuit comprises a series resistor between the charge pump and the at least one dielectric region.

11. The semiconductor wafer of claim 8, wherein the stress circuit comprises at least two different selectable connections between an output of the charge pump and the at least one dielectric region, wherein a first one of the selectable connections comprises a series resistor between the output of the charge pump and the at least one dielectric region, and wherein a second one of the selectable connections is devoid of the series resistor.

12. The semiconductor wafer of claim 8, wherein the stress circuit comprises at least two different selectable connections between a grounded input of the charge pump and the at least one dielectric region, wherein a first one of the selectable connections comprises a series resistor between the grounded input of the charge pump and the at least one dielectric region, and wherein a second one of the selectable connections is devoid of the series resistor.

13. The semiconductor wafer of claim 1, wherein the stress circuit comprises a linear voltage regulator, a DC-DC-converter or a voltage converter.

14. The semiconductor wafer of claim 1, wherein the stress circuit comprises a monitor operable to monitor leakage current of the at least one dielectric region during stressing.

15. The semiconductor wafer of claim 1, wherein the semiconductor wafer is a test wafer having a plurality of test sites, and wherein each of the test sites includes the stress circuit.

16. The semiconductor wafer of claim 1, wherein the semiconductor wafer is a product wafer having a plurality of product chips, and wherein each of the product chips or a monitoring region between adjacent ones of the product chips includes the stress circuit.

17. The semiconductor wafer of claim 16, wherein the stress circuit is included in the product chips, and wherein the stress circuit is further operable to disable each product chip for which a current leakage limit is exceeded as a result of stressing the at least one dielectric region included in that product chip.

18. The semiconductor wafer of claim 1, wherein the at least one dielectric region has an artificially weak breakdown characteristic and the reliability of the at least one dielectric region can be assessed at a lower stress voltage than if the artificially weak breakdown characteristic were omitted.

19. The semiconductor wafer of claim 18, wherein the artificially weak breakdown characteristic comprises at least one of a misaligned via in the at least one dielectric region, a metal line adjacent the at least one dielectric region with a protrusion extending toward another metal line adjacent the at least one dielectric region, and a ground rule spacing violation for metal lines between which the at least one dielectric region is interposed.

20. The semiconductor wafer of claim 1, wherein the stress circuit includes a pad connected to the at least one dielectric region for externally observing degradation of the at least one dielectric region.

21. A method of assessing dielectric reliability of a semiconductor technology, the method comprising:
fabricating a semiconductor wafer including dielectric regions of different thicknesses and a stress circuit fabricated on the same semiconductor wafer as the dielectric regions, some of the dielectric regions being thinner and other ones of the dielectric regions being thicker; and
stressing, by the stress circuit, at least one of the dielectric regions internally within the semiconductor wafer to assess dielectric reliability without the influence of an external circuit.

22. The method of claim 21, wherein stressing the at least one dielectric region internally within the semiconductor wafer comprises applying a stress voltage output by a stress circuit included in the semiconductor wafer across the at least one dielectric region, the stress voltage exceeding a rated operating voltage for the at least one dielectric region, the method further comprising:
measuring leakage current of the at least one dielectric region in response to the stress voltage.

23. The method of claim 21, further comprising:
applying a higher stress voltage than the supply voltage by the stress circuit to the at least one dielectric region, the higher stress voltage exceeding a rated operating voltage for the at least one dielectric region.

24. The method of claim 23, further comprising:
providing a first selectable connection between an output of the stress circuit and the at least one dielectric region, the first selectable connection comprising a series resistor between the output of the stress circuit and the at least one dielectric region; and
providing a second selectable connection between the output of the stress circuit and the at least one dielectric region, the second selectable connection being devoid of the series resistor.

25. The method of claim 23, further comprising:
providing a first selectable connection between a grounded input of the stress circuit and the at least one dielectric region, the first selectable connection comprising a series resistor between the grounded input of the stress circuit and the at least one dielectric region; and
providing a second selectable connection between the grounded input of the stress circuit and the at least one dielectric region, the second selectable connection being devoid of the series resistor.

26. The method of claim 21, further comprising:
monitoring leakage current of the at least one dielectric region internally within the semiconductor wafer during stressing.

27. The method of claim 21, further comprising:
forming the at least one dielectric region with an artificially weak breakdown characteristic so that the reliability of the at least one dielectric region can be assessed at a lower stress voltage than if the artificially weak breakdown characteristic were omitted.

28. The method of claim 27, wherein forming the at least one dielectric region with an artificially weak breakdown characteristic comprises forming at least one of a misaligned via in the at least one dielectric region, a metal line adjacent the at least one dielectric region with a protrusion extending toward another metal line adjacent the at least one dielectric region, and a ground rule spacing violation for metal lines between which the at least one dielectric region is interposed.

29. The method of claim 21, further comprising:
forming a pad connected to the at least one dielectric region for externally observing degradation of the at least one dielectric region.

* * * * *